(12) United States Patent
Rhyee et al.

(10) Patent No.: US 9,653,672 B2
(45) Date of Patent: *May 16, 2017

(54) THERMOELECTRIC MATERIALS, THERMOELECTRIC MODULE INCLUDING THERMOELECTRIC MATERIALS, AND THERMOELECTRIC APPARATUS INCLUDING THERMOELECTRIC MODULES

(75) Inventors: Jong-soo Rhyee, Yongin-si (KR); Sang-mock Lee, Yongin-si (KR)

(73) Assignee: SAMSUNG ELECTRONICS CO., LTD, Gyeonggi Do (KR)

( * ) Notice: Subject to any disclaimer, the term of this patent is extended or adjusted under 35 U.S.C. 154(b) by 1766 days.

This patent is subject to a terminal disclaimer.

(21) Appl. No.: 12/683,151

(22) Filed: Jan. 6, 2010

(65) Prior Publication Data

US 2010/0170553 A1    Jul. 8, 2010

(30) Foreign Application Priority Data

Jan. 6, 2009 (KR) .................. 10-2009-0000829
Sep. 23, 2009 (KR) .................. 10-2009-0090224

(51) Int. Cl.
*H01L 35/16* (2006.01)
*C01B 19/00* (2006.01)
(Continued)

(52) U.S. Cl.
CPC ............ *H01L 35/16* (2013.01); *C01B 19/002* (2013.01); *C01G 3/00* (2013.01); *C01G 15/006* (2013.01);
(Continued)

(58) Field of Classification Search
CPC ..................................... H01L 35/16
(Continued)

(56) References Cited

U.S. PATENT DOCUMENTS 3,197,410 A   7/1965  Brixner
3,223,640 A   12/1965 Brixner
(Continued)

FOREIGN PATENT DOCUMENTS

EP   1930960 A1   6/2008
JP   2004-288841 A   10/2001
(Continued)

OTHER PUBLICATIONS

Sams et al., Doping Studies and Thermoelectric Properties of TiS2, IEEE, 2005 International Conference on Thermoelectrics, pp. 99-101.*

(Continued)

*Primary Examiner* — Shannon Gardner
(74) *Attorney, Agent, or Firm* — Cantor Colburn LLP

(57) ABSTRACT

A thermoelectric material containing a dichalcogenide compound represented by Formula 1 and having low thermoelectric conductivity and high Seebeck coefficient:

$$R_a T_b X_{2-n} Y_n \qquad (1)$$

wherein R is a rare earth element, T includes at least one element selected from the group consisting of Group 1 elements, Group 2 elements, and a transition metal, X includes at least one element selected from the group consisting of S, Se, and Te, Y is different from X and includes at least one element selected from the group consisting of S, Se, Te, P, As, Sb, Bi, C, Si, Ge, Sn, B, Al, Ga and In, a is greater than 0 and less than or equal to 1, b is greater than or equal to 0 and less than 1, and n is greater than or equal to 0 and less than 2.

9 Claims, 8 Drawing Sheets

(51) Int. Cl.
| | |
|---|---|
| C01G 3/00 | (2006.01) |
| C01G 15/00 | (2006.01) |
| C01G 17/00 | (2006.01) |
| C01G 19/00 | (2006.01) |
| C01G 28/00 | (2006.01) |
| C01G 29/00 | (2006.01) |

(52) U.S. Cl.
CPC ......... *C01G 17/006* (2013.01); *C01G 19/006* (2013.01); *C01G 28/002* (2013.01); *C01G 29/006* (2013.01); *C01P 2006/32* (2013.01); *C01P 2006/40* (2013.01)

(58) Field of Classification Search
USPC ........................................................ 136/238
See application file for complete search history.

(56) References Cited

U.S. PATENT DOCUMENTS

| | | | |
|---|---|---|---|
| 3,306,857 A | 2/1967 | Brixner | |
| 3,372,997 A | 3/1968 | Bither, Jr. | |
| 3,519,402 A | 7/1970 | Hulliger | |
| 4,649,227 A | 3/1987 | Tributsch et al. | |
| 5,039,626 A | 8/1991 | Koma et al. | |
| 5,458,865 A * | 10/1995 | Novinson | 423/508 |
| 5,958,358 A | 9/1999 | Tenne et al. | |
| 2003/0056819 A1* | 3/2003 | Imai et al. | 136/239 |
| 2007/0262408 A1 | 11/2007 | Takagi et al. | |
| 2009/0211619 A1* | 8/2009 | Sharp et al. | 136/240 |

FOREIGN PATENT DOCUMENTS

| | | |
|---|---|---|
| JP | 2002-270907 A | 9/2002 |
| KR | 1020090106320 A | 10/2009 |
| SU | 351276 | 11/1971 |

OTHER PUBLICATIONS

Aitken et al., Metamagnetic Transition in EuSe2: A New Metastable Binary Rare-Earth Polychalcogenide, Chem. Mater. 1998, 10, 3928-3935.*

"Thermoelectric power generator", Encyclopedia Britannica Online Academic Edition, Encyclopaedia Britannica Inc, 2013. Web Sep. 18, 2013 <http://www.britannica.com/EBchecked/topic/591615/thermoelectric-power-generator>.*

Internet Archive Wayback Machine of thermoelectric power generator article from Encyclopaedia Britannica, accessed Sep. 19, 2013 <http://web.archive.org/web/20080525094500/http://www.britannica.com/EBchecked/topic/591615/thermoelectric-power-generator>.*

Gulay et al., Crystal Structures of the compounds R3CuSiS7 (R=Ce, Pr, Nd, Sm, Tb, Dy, Er) and R3CuSiSe7 (R=La Ce Pr Nd Sm Gd Tb and Dy), J of alloys and Compounds 431 (2007) 185-190.*

Preparation and Thermoelectric Properties of Some Rare Earth Chalcogenides, Takeshita et al., pp. 255-256, 1982.*

Bentien et al., "Experimental and theoretical investigations of strongly correlated FeSb2-xSnx", Phys. Rev. B, 74, 205105-1-205105-6, 2006.

Reid et al., "Electrical Properties of Selected Rare Earth Compounds and Alloys", Journal of the Electrochemical Society, vol. 111, No. 8, Aug. 1964, pp. 943-950.

Final Office Action dated Jan. 11, 2012 for U.S. Appl. No. 12/418,225.

Non-Final Office Action dated Nov. 9, 2012 for U.S. Appl. No. 12/418,225.

Final Office Action dated Feb. 26, 2013 for U.S. Appl. No. 12/418,225.

Chiritescu, C. et al., "Ultralow Thermal Conductivity in Disordered, Layered WSe2 Crystals", Science, Jan. 2007, 315: 351-353.

Imai, H. et al., "Large thermoelectric power factor in TiS2 crystal with nearly stoichiometric composition", Phys. Rev. B (Dec. 2001); vol. 64, 24, pp. 241104-1-241104-4.

Qin, X. Y. et al., "The effect of Mg substitution for Ti on transport and thermoelectric properties of TiS2", J. of Applied Physics, vol. 102, Issue 7, pp. 073703-073703-7 (2007).

Wang et al., "Sulfur Stoichiometry Effects in highly spin polarized CoS2 single crystals", App. Phys. Lett, 88, 232509-1-3, Jun. 2006.

U.S. Non-Final Office Action dated Sep. 9, 2011 for U.S. Appl. No. 12/418,225.

Dung et al., "Single-Crystal Structure of Copper Lanthanum Telluride Cu0.28LaTe2: A Disordered Tunnel Structure", Acta Cryst., C39, 1983, pp. 668-670.

Korean Office Action for Korean Patent Application No. 10-2009-0090224 dated Sep. 30, 2015.

* cited by examiner

THERMOELECTRIC MATERIALS, THERMOELECTRIC MODULE INCLUDING THERMOELECTRIC MATERIALS, AND THERMOELECTRIC APPARATUS INCLUDING THERMOELECTRIC MODULES

CROSS-REFERENCE TO RELATED APPLICATIONS

This application claims priority to Korean Patent Application No. 10-2009-0000829, filed on Jan. 6, 2009, and Korean Patent Application No. 10-2009-0090224, filed on Sep. 23, 2009, and all the benefits accruing therefrom under 35 U.S.C. §119, the contents of which in their entirety are herein incorporated by reference.

BACKGROUND

1. Field

One or more embodiments relate to thermoelectric materials having a high figure-of-merit, thermoelectric modules including the thermoelectric materials, and thermoelectric apparatuses including the thermoelectric modules, and more particularly, to dichalcogenide thermoelectric materials having a high Seebeck coefficient, high electrical conductivity, and low thermal conductivity, thermoelectric modules including the thermoelectric materials, and thermoelectric apparatuses including the thermoelectric modules.

2. Description of the Related Art

Figure 1:
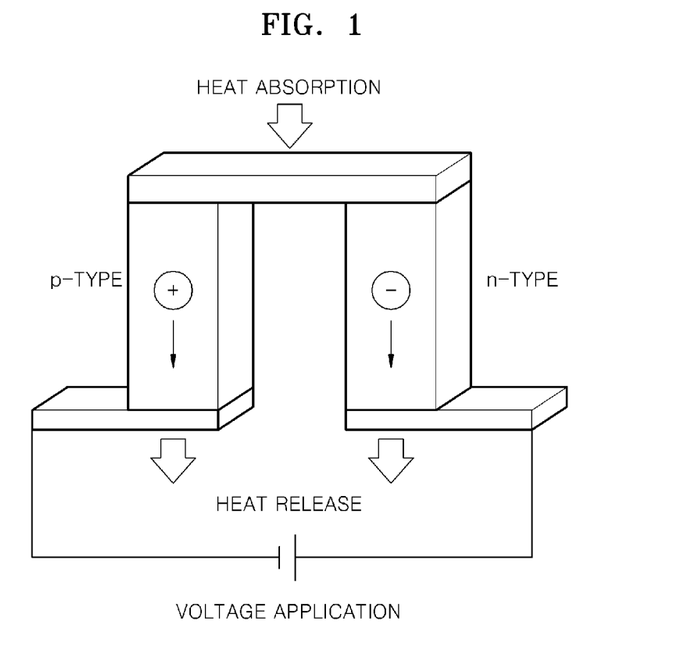
FIG. 1 is a schematic diagram illustrating an exemplary embodiment of a thermoelectric cooling system using the Peltier effect.
Figure 2:
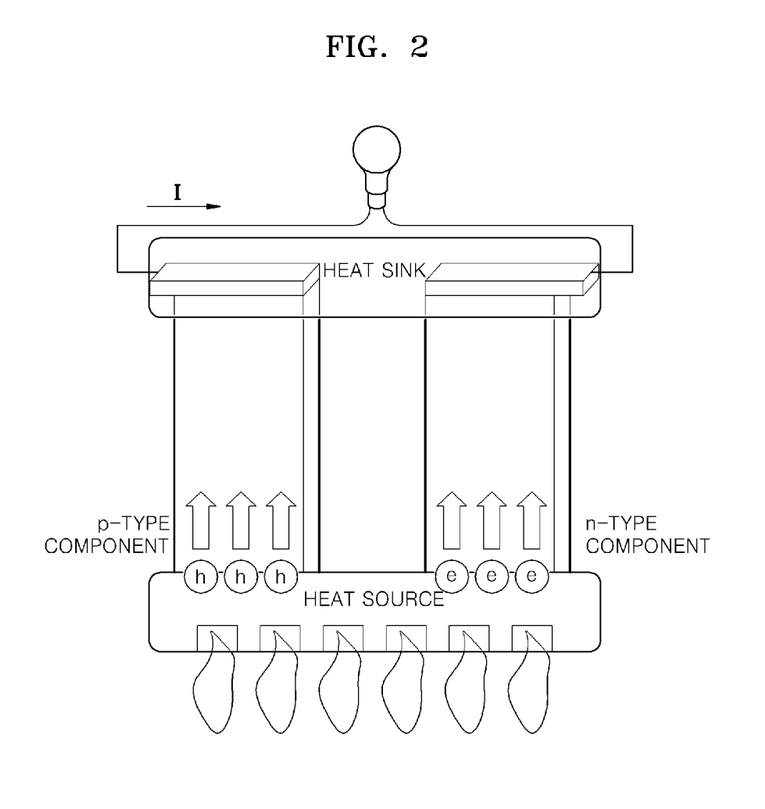
FIG. 2 is a schematic diagram illustrating an exemplary embodiment of a thermoelectric power generation system using the Seebeck effect.

Thermoelectric materials can be applied in active cooling and cogeneration using the Peltier effect and Seebeck effect. The Peltier effect refers to a phenomenon whereby, when an external DC voltage is applied as illustrated in FIG. 1, holes in a p-type material and electrons in an n-type material are transported and thus one end of each of the respective materials absorbs heat and the other end of the materials releases heat. The Seebeck effect refers to a phenomenon whereby, when heat is supplied by an external heat source as illustrated in FIG. 2, electrons and holes are transported and thus current flows in a material, thereby generating power.

Active cooling with a thermoelectric material can improve the thermal stability of a device, does not generate vibration and noise, and does not use a separate condenser or refrigerant. As a result, thermoelectric active cooling is regarded as an environmentally friendly method of cooling that is suitable for small devices. Active cooling with thermoelectric materials can be applied in refrigerators or air conditioners that do not include refrigerants, and various other micro-cooling systems. Further, a uniform, stable temperature may be obtained. Accordingly, the performance of the device may be improved.

In addition, if the Seebeck effect and thermoelectric materials are used for thermoelectric power generation, waste heat may be used as an energy source. Accordingly, the energy efficiency of car engines or exhausts may be improved. Also, electrical power may be generated from waste incinerators or from the waste heat of ironworking. In addition, the efficiency of a power source for a medical device, which uses body heat and is installed inside the body, may be increased. Thus waste heat may be collected and used in various applications.

A factor for evaluating the performance of a thermoelectric material is a dimensionless figure-of-merit ZT that is defined by Equation 1:

$$ZT = \frac{S^2 \sigma T}{k} \qquad \text{Equation 1}$$

where S is a Seebeck coefficient, σ is electrical conductivity, T is an absolute temperature, and k is thermal conductivity.

To increase the dimensionless figure-of-merit ZT, there is a need to search for a material that has a high Seebeck coefficient, high electrical conductivity, and low thermal conductivity.

SUMMARY

Provided are thermoelectric materials having a high Seebeck coefficient, high electrical conductivity, and low thermal conductivity.

Provided are thermoelectric modules including the thermoelectric materials.

Provided are thermoelectric apparatuses including the thermoelectric modules.

Additional aspects will be set forth in part in the description which follows and, in part, will be apparent from the description.

According to an aspect, a thermoelectric material includes a dichalcogenide compound represented by Formula 1:

wherein R is a rare earth element, T includes at least one element selected from the group consisting of Group 1 elements, Group 2 elements, and a transition metal, X includes at least one element selected from the group consisting of S, Se, and Te, Y is different from X and includes at least one element selected from the group consisting of S, Se, Te, P, As, Sb, Bi, C, Si, Ge, Sn, B, Al, Ga and In, a is greater than 0 and less than or equal to 1, b is greater than or equal to 0 and less than 1, and n is greater than or equal to 0 and less than 2, wherein a+b is greater than 1 and less than or equal to 2.

The thermoelectric material may have a disordered structure in an in-plane direction, and may have the structure represented by Formula 1.

The thermoelectric material having a layered structure may include: a first layer including X, or X and Y; and a second layer including X and R, or X and Y and R, wherein the first layer and the second layer are alternately arranged and T is doped or intercalated between the first layer and the second layer.

The thermoelectric material may exhibit a charge density wave.

The thermoelectric material may have two-dimensional electrical conductivity characteristics.

The thermoelectric material may include a bulk phase.

The thermoelectric material may be polycrystalline or single-crystalline.

According to another aspect, a thermoelectric module includes a first electrode, a second electrode, and a dichalcogenide compound represented by Formula 1 interposed between the first electrode and the second electrode.

According to another aspect, a thermoelectric apparatus includes the thermoelectric module and a heat source.

Also disclosed is a thermoelectric material represented by Formula 1, including a layered structure having a disordered structure in an in-plane direction:

wherein R is a rare earth element, T includes at least one element selected from the group consisting of Group 1 elements, Group 2 elements, and a transition metal, X includes at least one element selected from the group consisting of S, Se, and Te, Y is different from X and includes at least one element selected from the group consisting of S, Se, Te, P, As, Sb, Bi, C, Si, Ge, Sn, B, Al, Ga and In, a is greater than 0 and less than or equal to 1, b is greater than or equal to 0 and less than 1, and n is greater than or equal to 0 and less than 2.

Also disclosed is a thermoelectric device including: a first electrode; a second electrode; and a thermoelectric material interposed between the first electrode and the second electrode, the thermoelectric material includes a dichalcogenide compound represented by Formula 1:

$$R_aT_bX_{2-n}Y_n \quad (1)$$

wherein R is a rare earth element, T includes at least one element selected from the group consisting of Group 1 elements, Group 2 elements, and a transition metal, X includes at least one element selected from the group consisting of S, Se, and Te, Y is different from X and includes at least one element selected from the group consisting of S, Se, Te, P, As, Sb, Bi, C, Si, Ge, Sn, B, Al, Ga and In, a is greater than 0 and less than or equal to 1, b is greater than or equal to 0 and less than 1, and n is greater than or equal to 0 and less than 2.

Also disclosed is a thermoelectric apparatus includes: a heat source; and a thermoelectric device, the thermoelectric device includes: a first electrode; a second electrode; and a thermoelectric material interposed between the first electrode and the second electrode, the thermoelectric material includes a dichalcogenide compound represented by Formula 1:

$$R_aT_bX_{2-n}Y_n \quad (1)$$

wherein R is a rare earth element, T includes at least one element selected from the group consisting of Group 1 elements, Group 2 elements, and a transition metal, X includes at least one element selected from the group consisting of S, Se, and Te, Y is different from X and includes at least one element selected from the group consisting of S, Se, Te, P, As, Sb, Bi, C, Si, Ge, Sn, B, Al, Ga and In, a is greater than 0 and less than or equal to 1, b is greater than or equal to 0 and less than 1, and n is greater than or equal to 0 and less than 2.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. It will be understood that, although the terms first, second, third, etc., can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments of the invention.

Spatially relative terms, such as "below," "lower," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device can be otherwise oriented (rotated 90 degrees or at other orientations) and the spatially relative descriptors used herein interpreted accordingly.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

The thermal conductivity and electrical conductivity of thermoelectric materials may vary according to the structure thereof. For example, a thermal conductivity ($k_{tot}$) of a material is the sum of a thermal conductivity ($k_{Latt}$) with respect to a lattice and a thermal conductivity ($k_{el}$) with respect to electrons. However, the thermal conductivity ($k_{el}$) with respect to electrons is determined according to the Wiedemann-Franz rule represented by Equation 2 below and thus, cannot be controlled. Accordingly, to reduce the thermal conductivity ($k_{tot}$) of the thermoelectric material, the thermal conductivity ($k_{Latt}$) with respect to the lattice may be decreased and the decrease may be achieved by controlling a lattice structure.

$$K_{el}=LT/\rho(L=2.44\times10^{-8}\ \Omega W/K^2)$$

Equation 2

A thermoelectric material according to an embodiment includes a dichalcogenide compound represented by Formula 1:

$$R_a T_b X_{2-n} Y_n \quad (1)$$

where

R is a rare earth element,

T includes at least one element selected from the group consisting of Group 1 elements, Group 2 elements, and a transition metal, X includes at least one element selected from the group consisting of S, Se, and Te, Y is different from X and includes at least one element selected from the group consisting of S, Se, Te, P, As, Sb, Bi, C, Si, Ge, Sn, B, Al, Ga and In, a is greater than 0 and less than or equal to 1, b is greater than or equal to 0 and less than 1, and n is greater than or equal to 0 and less than 2.

In Formula 1, a+b may be greater than 1 and less than or equal to 2.

Figure 3:
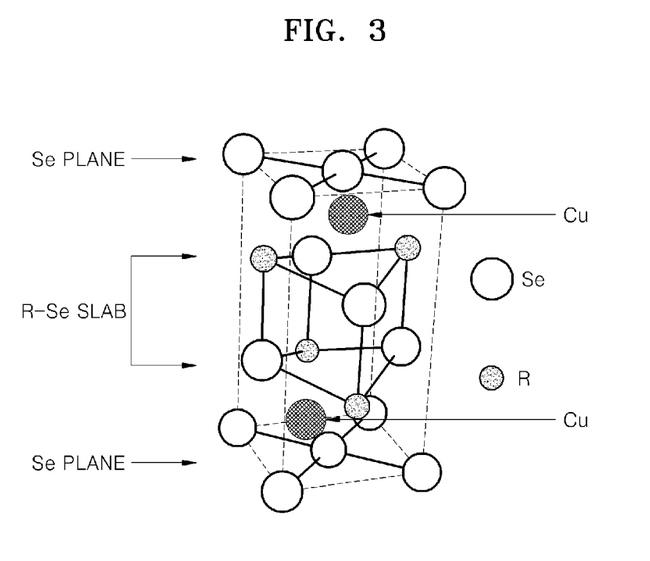
FIG. 3 is a schematic diagram illustrating the structure of an exemplary embodiment of $R_aT_bX_{2-n}Y_n$ according to an embodiment.

As illustrated in FIG. 3, the thermoelectric material may have a layered structure in which a first layer and a second layer are alternately disposed, wherein the first layer may include X, or X and Y, and the second layer may include X and R, or X and Y and R.

In each of the first layer and the second layer, elements are covalently bonded and irregularly arranged in an in-plane direction, and are thus strongly bonded to each other. In addition, the first layer and the second layer may be bonded to each other by ionic bonding or van der Waals bonding, and are thus may be weakly bonded to each other in a c-axis direction. Accordingly, the thermoelectric material may have low thermal conductivity. Also, since electrons are transported through bonded elements, two-dimensional electrical conductivity characteristics may be obtained.

In the thermoelectric material, conductive electrons of X (S, Se, and Te: chalcogen) of the first layer may strongly interact with 4f orbital function electrons of R (rare earth element) of the second layer, and thus lattice distortion may occur and a charge density wave may be generated.

In addition, T (alkali metal, transition metal) may be doped or intercalated between the first layer and the second layer. Due to the intercalation of T, electrical conductivity of the thermoelectric material may be increased and the current density may be controlled. By the generation of the charge density wave and the charge density control using the doping or intercalation of T, the thermoelectric material may have high electrical conductivity and a high Seebeck coefficient. In addition, the intercalation of T may lead to an increase in the binding force in the c-axis direction, thereby enhancing mechanical strength of the thermoelectric material.

The electrical conductivity and the Seebeck coefficient may also be increased by controlling the type or amount of Y. For example, if two-band conduction in which electrons and holes co-exist occurs, X may be partly substituted with Y in order to generate electrical conductivity in either electrons or holes, thereby controlling the current density of the thermoelectric material.

The thermoelectric material may be polycrystalline or single-crystalline. If the thermoelectric material is grown to be single-crystalline, a single crystal may be easily disposed in the c-axis direction in which thermal conductivity is low. Accordingly, the thermal conductivity may be further lowered and the figure-of-merit may be increased.

Also, the thermoelectric material may have a bulk phase.

If the thermoelectric material is polycrystalline, the thermoelectric material may be prepared using one of the polycrystalline synthesis methods described below. However, the preparation method is not limited to these methods.

In an embodiment, the thermoelectric material may be prepared by a method using ampoules, whereby a source material is loaded into a quartz tube, a metal ampoule or the like, and the tube or ampoule is sealed under vacuum, and then the sealed tube or ampoule is heat treated.

In another embodiment, the thermoelectric material may be prepared by an arc melting method, whereby a source material is loaded into a chamber and then exposed to an arc discharge under an inactive gas atmosphere in order to melt the source material, thereby preparing a thermoelectric material.

In another embodiment, the thermoelectric material may be prepared by a solid state reaction method, whereby a powder is mixed and the mixture is rigidly processed and heat treated, or the mixture is heat treated and then processed and sintered.

If the thermoelectric material is single-crystalline, the thermoelectric material may be prepared using one of the single crystal synthesis methods described below. However, the preparation method is not limited to these methods.

A metal flux method, whereby an element providing a condition under which a source material grows into a crystal at high temperature is loaded into a melting pot and then a heat treatment process is performed thereon at high temperature, thereby growing a crystal.

A Bridgeman method, whereby a source material is loaded into a melting pot and the source material at an end of the melting pot is heated at high temperature until the source material melts, and then, a high temperature zone is slowly shifted in order to locally melt the source material until the entire source material is completely exposed to the high temperature zone, thereby growing a crystal.

A zone melting method, whereby a source material is formed in a seed rod and a feed rod and a portion of the source material is melted by local heating at high temperature, and then the molten zone is slowly moved upward, thereby growing a crystal.

A vapor transport method, whereby a source material is placed at the bottom of a quartz tube and heated, and the top of the quartz tube has a low temperature, wherein, when the source material is evaporated, the evaporated source material is solidified, thereby growing a crystal.

The thermoelectric material may be manufactured using any of the methods described above, and the method is not limited thereto.

Meanwhile, if the thermoelectric material is polycrystalline, a compression process may be additionally performed. By performing the compression process, electrical conductivity may be further improved.

Examples of the compression process include hot pressing method, whereby a powder compound is loaded into a mold having a selected shape and then molding is performed at high temperature, for example, at a temperature of about 300 to about 800° C., and at high pressure, for example, at a pressure of about 30 to about 300 MPa.

Other examples of the compression process include a spark plasma sintering method, whereby a power compound is sintered for a short period of time by applying a high current, for example, a current of 50 to 500 A thereto at a high pressure, for example, a pressure of about 30 MPa to about 300 MPa; and a hot forging method, whereby during molding under pressure, a powder is subjected to extruding and sintering at high temperature, for example, at a temperature of about 300 to about 700° C.

Due to the compression processes described above, the density of the thermoelectric material reaches about 70 to about 100% of a theory density. The theory density is calculated by divining a molecular weight by an atomic volume, and evaluated as a lattice constant. For example, the thermoelectric material has a density of about 95 to about 100% and thus has higher electrical conductivity.

A thermoelectric device according to an embodiment is obtained by molding the thermoelectric material by, for example, cutting. If the thermoelectric material has a single-crystalline structure, the cutting direction of the thermoelectric material may be perpendicular to a growth direction.

The thermoelectric device may be a p-type thermoelectric device or n-type thermoelectric device. The thermoelectric device is manufactured by forming the thermoelectric material into a selected shape, for example, into a rectangular parallelepiped.

Meanwhile, the thermoelectric device may have a cooling effect when combined with an electrode and a current is applied thereto, and also have a power generation effect due to the device or a temperature difference.

Figure 4:
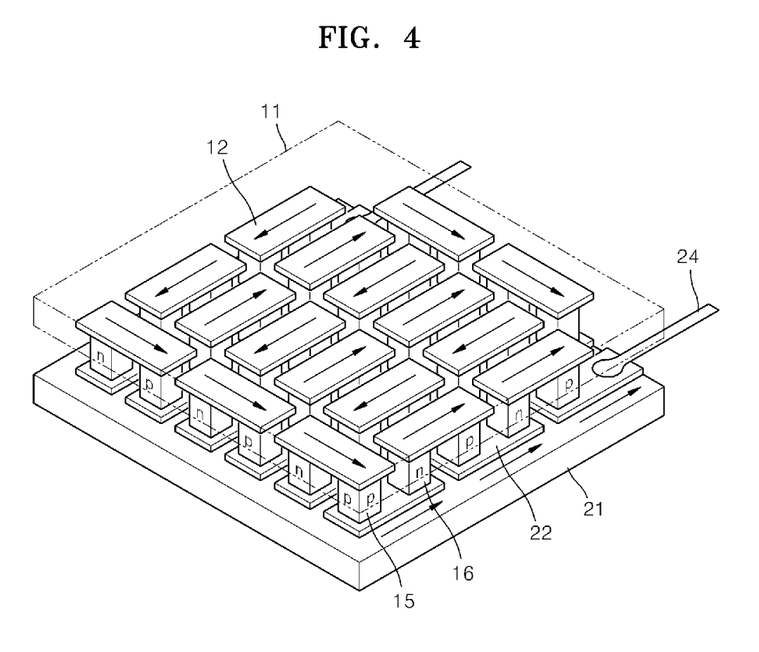
FIG. 4 is a graph of a thermoelectric module according to an embodiment.

FIG. 4 is a view of a thermoelectric module including a thermoelectric device, according to an embodiment. Referring to FIG. 4, a top electrode 12 and a bottom electrode 22 are patterned on a top insulating substrate 11 and a bottom insulating substrate 21. The top electrode 12 and the bottom electrode 22 contact a p-type thermoelectric component 15 and an n-type thermoelectric component 16. The top and bottom electrodes 12 and 22 are connected to the outside the thermoelectric device by a lead electrode 24.

The top and bottom insulating substrates 11 and 21 may be a gallium arsenic GaAs, sapphire, silicon, Firex, or quartz substrate. The top and bottom electrodes 12 and 22 may include aluminum, nickel, gold, or titanium, and may have various sizes. The top and bottom electrodes 12 and 22 may be formed using any conventional pattering method. For example, the top and bottom electrodes 12 and 22 may be formed using a lift-off semiconductor process, a deposition method, or a photolithography technique.

According to another embodiment, the thermoelectric module may include, as illustrated in FIGS. 1 and 2, a first electrode, a second electrode, and the thermoelectric material represented by Formula 1 interposed between the first electrode and the second electrode. The thermoelectric module may further include, as illustrated in FIG. 4, an insulating substrate on which at least one of the first electrode and the second electrode is disposed. The insulating substrate may be the insulating substrate that has been described above.

According to another embodiment, in the thermoelectric module, either the first electrode or the second electrode may be exposed to a heat source as illustrated in FIGS. 1 and 2. According to an embodiment, in the thermoelectric device, either the first electrode or the second electrode may be electrically connected to a power supplier illustrated in FIG. 1, or to the outside the thermoelectric module, for example, an electric device (for example, battery) that consumes or stores electric powder.

According to another embodiment, in the thermoelectric module, either the first electrode or the second electrode may be electrically connected to a power supplier illustrated in FIG. 1.

According to another embodiment, in the thermoelectric module, as illustrated in FIG. 4, the p-type thermoelectric device and the n-type thermoelectric device may be alternately disposed, and at least one of the p-type thermoelectric device and the n-type thermoelectric device may include the thermoelectric material containing the dichalcogenide compound represented by Formula 1.

A thermoelectric apparatus according to an embodiment includes a heat source and the thermoelectric module, wherein the thermoelectric module includes a thermoelectric material that absorbs heat from the heat source and contains the dichalcogenide compound represented by Formula 1, a first electrode, and a second electrode, wherein the second electrode faces the first electrode. Either the first electrode or the second electrode may contact the thermoelectric material.

According to another embodiment, the thermoelectric apparatus may further include an electric power supplier that is electrically connected to the first electrode and the second electrode. According to another embodiment, the thermoelectric apparatus may further include an electric power supplier that is electrically connected to either the first electrode or the second electrode.

The thermoelectric material, the thermoelectric device, the thermoelectric module, and the thermoelectric apparatus may be, for example, a thermoelectric cooling system or a thermoelectric power generation system, and the thermoelectric cooling system may be a micro cooling system, a conventionally used cooling device, an air conditioner, or a waste heat power generation system, but is not limited thereto. The structure and manufacturing method of the thermoelectric cooling system are well known in the art and thus will not be described in detail herein.

The embodiments will be described in further detail with reference to the following examples. These examples are for illustrative purposes only and are not intended to limit the scope of the embodiments.

Example 1

Ce, Se and Cu were quantified in molar ratios of 1:2.3:0.1, 1:2.3:0.2, and 1:2.3:0.3 and then each mixture was placed into an ampoule made of a quartz tube. Each of the ampoules was vacuum-sealed and heat treated at 850° C. for 24 hours, thereby synthesizing $Ce_{0.9}Cu_{0.1}Se_2$, $Ce_{0.8}Cu_{0.2}Se_2$, and $Ce_{0.7}Cu_{0.3}Se_2$. In this case, the molar ratios of the respective compounds were identified by inductively coupled plasma spectroscopy.

Experimental Example 1: Thermal Conductivity Evaluation

Figure 5:
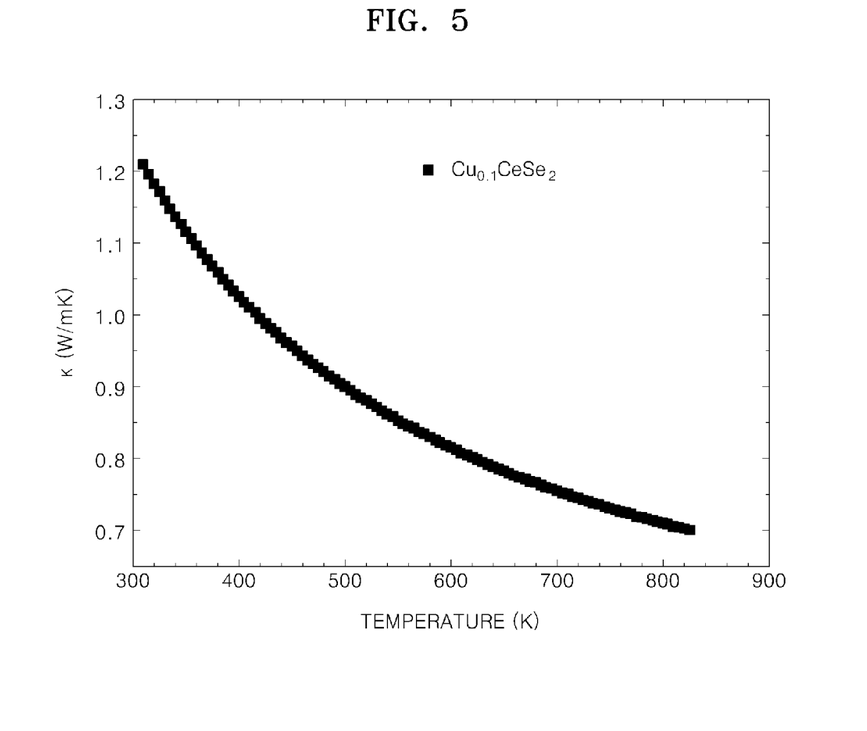
FIG. 5 is a graph illustrating thermal conductivity of $Ce_{0.9}Cu_{0.1}Se_2$ measured according to Experimental Example 1.

Among the thermoelectric materials synthesized in Example 1, the thermal conductivity of $Ce_{0.9}Cu_{0.1}Se_2$ was measured. The results are shown in FIG. 5. In this experiment, the thermal conductivity was evaluated based on thermal relaxation measured using a laser flash method.

Referring to FIG. 5, the thermal conductivity of the thermoelectric material was as low as about 1.2 W/mK at a temperature of 300 K. Such thermal conductivity is far lower than that of a commercially available thermoelectric material such as $Bi_2Te_3$, or Sb-doped $Bi_2Te_3$.

Experimental Example 2: Seebeck Coefficient Evaluation

Figure 6:
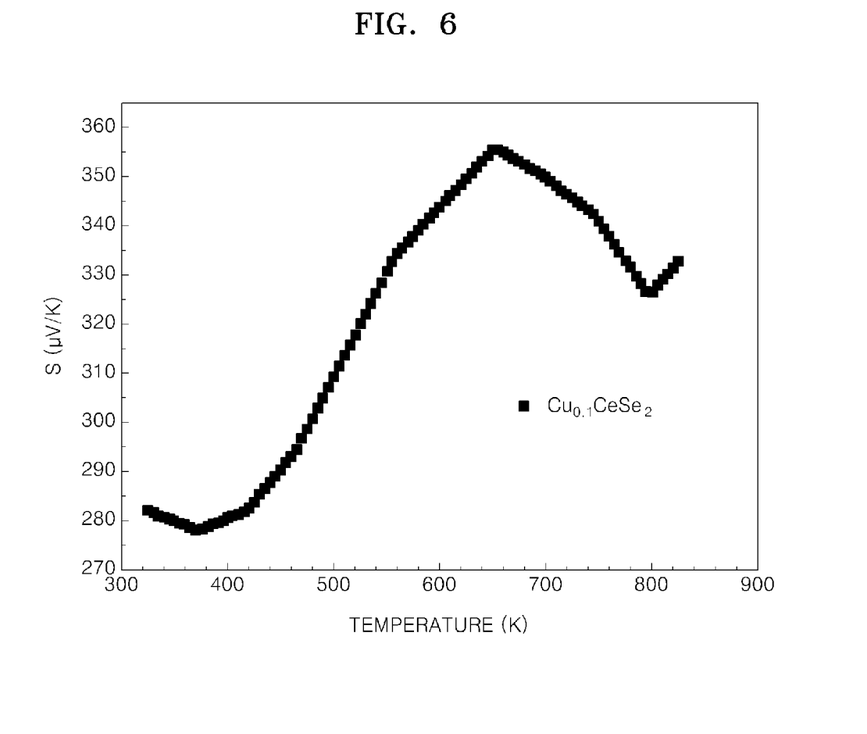
FIG. 6 is a graph illustrating a Seebeck coefficient of $Ce_{0.9}Cu_{0.1}Se_2$ measured according to Experimental Example 2.

Among the thermoelectric materials synthesized in Example 1, the Seebeck coefficient of $Ce_{0.9}Cu_{0.1}Se_2$ was measured. The results are shown in FIG. 6. The Seebeck coefficient was as high as 320 to 350 µV/K in a thermoelectric material evaluation temperature region in a range of 300 to 800 K. The Seebeck coefficient was measured using a 4-terminal method.

Experimental Example 3: Electrical Resistance Evaluation

Figure 7:
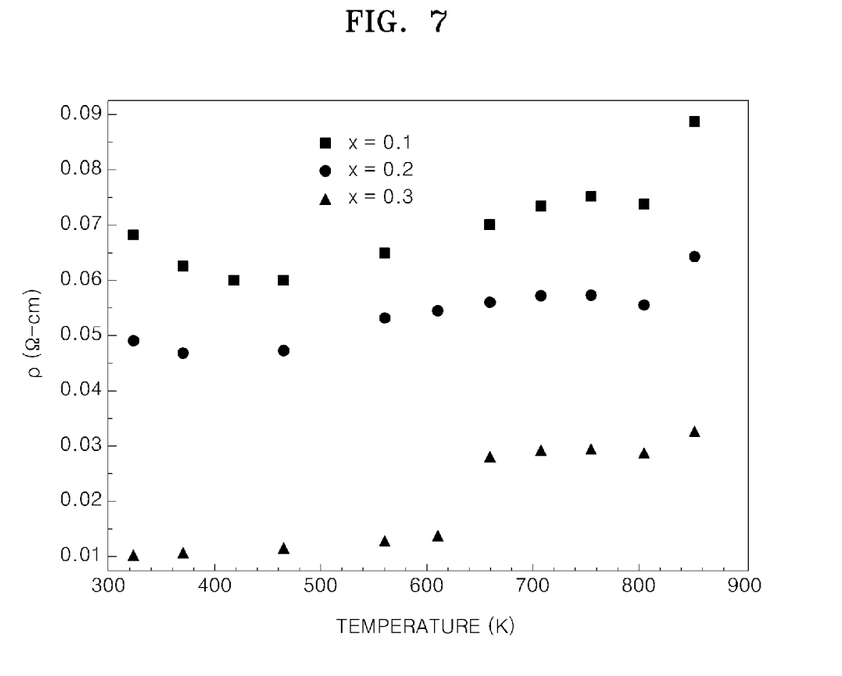
FIG. 7 is a graph illustrating electrical resistance of $Ce_{0.9}Cu_{0.1}Se_2$, $Ce_{0.8}Cu_{0.2}Se_2$, and $Ce_{0.7}Cu_{0.3}Se_2$ measured according to Experimental Example 3.

The electrical resistance of $Ce_{0.9}Cu_{0.1}Se_2$, $Ce_{0.8}Cu_{0.2}Se_2$, and $Ce_{0.7}Cu_{0.3}Se_2$ which were synthesized according to Example 1 was measured. The results are shown in FIG. 7. The electrical resistance was measured using a 4-terminal method.

Referring to FIG. 7, the thermoelectric materials have very low electrical resistance, and as the amount of Cu used is increased, the electrical resistance is reduced. The thermoelectric materials have very high electrical conductivity.

Experimental Example 4: Figure-of-merit (ZT) Calculation

Figure 8:
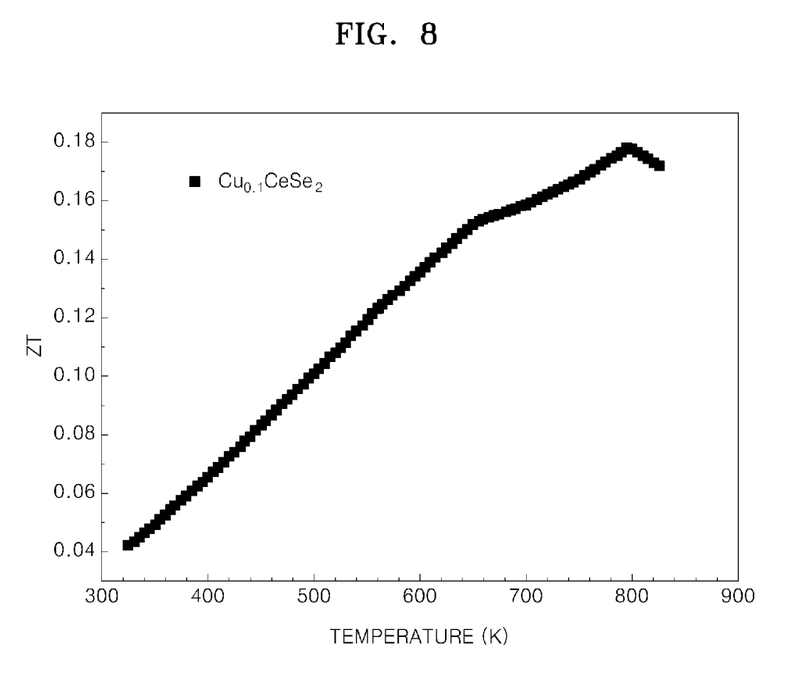
FIG. 8 is a graph illustrating a figure-of-merit of $Ce_{0.9}Cu_{0.1}Se_2$ calculated according to Experimental Example 4.

With respect to $Ce_{0.9}Cu_{0.1}Se_2$ synthesized according to Example 1, the figure-of-merit was calculated based on the results of Experimental Examples 1 through 3. The results are shown in FIG. 8. The thermoelectric material had a very high figure-of-merit of 0.18 at a temperature of 800 K. Also, as the temperature increased, the figure-of-merit was significantly increased.

As described above, the thermoelectric materials according to the one or more of the above embodiments have a high Seebeck coefficient, high electrical conductivity, and low thermal conductivity, and thus have a high figure-of-merit. Accordingly, the thermoelectric materials are useful for refrigerators that do not include refrigerants, air conditioners, waste heat power generation, thermoelectric nuclear power generation for the military, aviation, and space industries, and micro cooling systems.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A thermoelectric material comprising a chalcogenide compound represented by Formula 1:

$$R_a T_b X_{2-n} Y_n \quad (1)$$

wherein R is at least one rare earth element selected from Sc, Y, Ce, Pr, Nd, Pm, Sm, Eu, Gd, Tb, Dy, Ho, Er, Tm, Yb and Lu, T comprises at least one element selected from the group consisting of Li, Na, K, Rb, Cs, Fr, Be, Mg, Ca, Sr, Ba, Ra, Sc, Y, Rf, Db, Sg, Mn, Tc, Re, Bh, Fe, Ru, Os, Hs, Co, Rh, Mt, Ni, Pd, Pt, Ds, Cu, Ag, Au, Rg, Zn, Cd, Hg and Cn, X comprises at least one element selected from the group consisting of S, Se, and Te, Y is different from X and comprises at least one element selected from the group consisting of S, Se, Te, P, As, Sb, Bi, C, Ge, Sn, B, Al, Ga and In, a is greater than 0 and less than or equal to 1, b is greater than 0 and less than or equal to 0.3, and n is greater than or equal to 0 and less than 2, wherein in a crystal structure of the thermoelectric material, elements R and T are disposed between layers consisting of element X.

2. The thermoelectric material of claim 1, wherein a+b is greater than 1 and less than 2.

3. The thermoelectric material of claim 1, wherein the thermoelectric material is polycrystalline.

4. Thermoelectric material of claim 1, wherein the thermoelectric material is single-crystalline.

5. A thermoelectric device comprising:
a first electrode;
a second electrode; and
a thermoelectric material interposed between the first electrode and the second electrode, the thermoelectric material comprising a chalcogenide compound represented by Formula 1:

$$R_a T_b X_{2-n} Y_n \quad (1)$$

wherein R is at least one rare earth element selected from Sc, Y, Ce, Pr, Nd, Pm, Sm, Eu, Gd, Tb, Dy, Ho, Er, Tm, Yb and Lu, T comprises at least one element selected from the group consisting of Li, Na, K, Rb, Cs, Fr, Be, Mg, Ca, Sr, Ba, Ra, Sc, Y, Rf, Db, Sg, Mn, Tc, Re, Bh, Fe, Ru, Os, Hs, Co, Rh, Mt, Ni, Pd, Pt, Ds, Cu, Ag, Au, Rg, Zn, Cd, Hg and Cn, X comprises at least one element selected from the group consisting of S, Se, and Te, Y is different from X and comprises at least one element selected from the group consisting of S, Se, Te, P, As, Sb, Bi, C, Ge, Sn, B, Al, Ga and In, a is greater than 0 and less than or equal to 1, b is greater than 0 and less than or equal to 0.3, and n is greater than or equal to 0 and less than 2, wherein in a crystal structure of the thermoelectric material, elements R and T are disposed between layers consisting of element X.

6. A thermoelectric apparatus comprising:
a heat source; and
a thermoelectric device, the thermoelectric device comprising:
a first electrode;
a second electrode; and a thermoelectric material interposed between the first electrode and the second electrode, the thermoelectric material comprising a chalcogenide compound represented by Formula 1:

$$R_aT_bX_{2-n}Y_n \quad (1)$$

wherein R is at least one rare earth element selected from Sc, Y, Ce, Pr, Nd, Pm, Sm, Eu, Gd, Tb, Dy, Ho, Er, Tm, Yb and Lu, T comprises at least one element selected from the group consisting of Li, Na, K, Rb, Cs, Fr, Be, Mg, Ca, Sr, Ba, Ra, Sc, Y, Rf, Db, Sg, Mn, Tc, Re, Bh, Fe, Ru, Os, Hs, Co, Rh, Mt, Ni, Pd, Pt, Ds, Cu, Ag, Au, Rg, Zn, Cd, Hg and Cn, X comprises at least one element selected from the group consisting of S, Se, and Te, Y is different from X and comprises at least one element selected from the group consisting of S, Se, Te, P, As, Sb, Bi, C, Ge, Sn, B, Al, Ga and In, a is greater than 0 and less than or equal to 1, b is greater than 0 and less than or equal to 0.3, and n is greater than or equal to 0 and less than 2, wherein in a crystal structure of the thermoelectric material, elements R and T are disposed between layers consisting of element X.

7. The thermoelectric material of claim 1, wherein n is 0.

8. The thermoelectric device of claim 5, wherein n is 0.

9. The thermoelectric apparatus of claim 6, wherein n is 0.

* * * * *